United States Patent
Tong et al.

(10) Patent No.: US 6,692,581 B2
(45) Date of Patent: Feb. 17, 2004

(54) SOLDER PASTE FOR FABRICATING BUMP

(75) Inventors: Ho-Ming Tong, Taipei (TW);
Chun-Chi Lee, Kaohsiung (TW);
Jen-Kuang Fang, Pingtung Hsien (TW);
Ching-Fu Horng, Penghu (TW);
Shih-Kuang Chen, Kaohsiung (TW);
Shyh-Ing Wu, Kaohsiung (TW);
Chun-Hung Lin, Tainan Hsien (TW);
Yung-Chi Lee, Kaohsiung (TW);
Yu-Chen Chou, Kaohsiung (TW);
Tsung-Hua Wu, Kaohsiung Hsien (TW); Su Tao, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/248,802

(22) Filed: Feb. 20, 2003

(65) Prior Publication Data

US 2003/0164204 A1 Sep. 4, 2003

(30) Foreign Application Priority Data

Mar. 1, 2002 (TW) ........................ 91103732 A

(51) Int. Cl.$^7$ ............................. B23K 35/363
(52) U.S. Cl. ........................... 148/24; 75/255
(58) Field of Search ................. 148/24; 75/255

(56) References Cited

U.S. PATENT DOCUMENTS

| 4,872,928 A | * | 10/1989 | Jacobs ........................ 148/24 |
| 5,118,364 A | * | 6/1992 | Frazier ....................... 148/23 |
| 5,150,832 A | * | 9/1992 | Degani et al. ............... 228/224 |
| 5,382,300 A | * | 1/1995 | Blonder et al. ............... 148/24 |
| 5,435,480 A | * | 7/1995 | Hart et al. ................. 228/180.1 |
| 5,532,186 A | * | 7/1996 | Kobayashi ................. 437/182 |
| 5,788,143 A | * | 8/1998 | Boyd et al. ................ 228/253 |
| 5,872,400 A | * | 2/1999 | Chapman et al. ........... 257/738 |
| 6,153,940 A | * | 11/2000 | Zakel et al. ................ 257/779 |
| 6,179,200 B1 | * | 1/2001 | Kung et al. ................ 228/254 |

OTHER PUBLICATIONS

ASM Handbook, vol. 7, Powder Metallurgy, pp. 176, 837, 1984.*

* cited by examiner

Primary Examiner—Daniel J. Jenkins
(74) Attorney, Agent, or Firm—Jiang Chyun IP Office

(57) ABSTRACT

A solder paste for fabricating bumps includes a flux and metallic alloy powder. The metallic alloy powder includes a plurality of low eutectic metallic alloy granules, and the size of these metallic alloy granules is 20–60 $\mu$m and the average size of the metallic granules is 35 $\mu$m to 45 $\mu$m.

12 Claims, 3 Drawing Sheets

| | | solder paste A | solder paste B | solder paste C |
|---|---|---|---|---|
| composition | metallic alloy | 95 Pb/5 Sn | 95 Pb/5 Sn | 95 Pb/5 Sn |
| | flux | flux A | flux B | flux B |
| wt % of metallic alloy | | 85~95% | 85~95% | 85~95% |
| granules size of metallic alloy | | 4~25 $\mu$m | 4~25 $\mu$m | 20~60 $\mu$m |
| Ave. value of granules size | | 12 $\mu$m | 12 $\mu$m | 40 $\mu$m |
| viscosity | | 165~185 Pas | 175~185 Pas | 175~185 Pas |

|  | | solder paste A | solder paste B | solder paste C |
|---|---|---|---|---|
| composition | metallic alloy | 95 Pb/5 Sn | 95 Pb/5 Sn | 95 Pb/5 Sn |
|  | flux | flux A | flux B | flux B |
| wt % of metallic alloy | | 85~95% | 85~95% | 85~95% |
| granules size of metallic alloy | | 4~25 μm | 4~25 μm | 20~60 μm |
| Ave. value of granules size | | 12 μm | 12 μm | 40 μm |
| viscosity | | 165~185 Pas | 175~185 Pas | 175~185 Pas |

SOLDER PASTE FOR FABRICATING BUMP

CROSS REFERENCE TO RELATED APPLICATIONS

This application claims the priority benefit of Taiwan application serial no. 91103732, filed on Mar. 1, 2002.

BACKGROUND OF INVENTION

1. Field of the Invention

The present invention relates to solder paste, and in particular, a solder paste for fabricating bumps.

2. Description of the Related Art

The development of IC packaging technology moves along the miniaturized and high density trend, and in particular, with the development of high density IC packaging technology, such as flip chip packaging, the shortened signal path assists the upgrading of transmission speed.

Thus, flip chip bonding technology is gradually becoming the mainstream of high density packaging.

In common flip chip bonding technology, after the re-distribution process, a bump is formed on the bonding pads (I/O connection point) of the wafer.

The wafer is cut into a single chip which is then flipped, and a bump is then used to connect the chip to the substrate.

In the above mentioned bump fabrication, generally, the surface of the bonding pad of the wafer is first formed into an under ball metallurgy layer and then a photo sensitive dry film is adhered.

Next, the dry film is patterned and an opening is formed on the dry film. After that, the opening is filled with solder paste. Next, a re-flow process of solder paste is performed so as to form a spherical bump. Finally, the dry film is removed.

In order to cause the solder paste to smoothly become a spherical shape and to remove the unnecessary oxides and impurities within the solder paste, generally the solder paste is mixed with flux. By means of the re-flow process of solder paste, the reaction between the flux and the solder paste causes the oxides and impurities of the solder paste to be brought to the surface of the bump. After that, the flux is removed.

In the conventional re-flow process of the solder paste, voids will normally remain in the bump and the yield and reliability of the bump is reduced.

In view of the above, the drawbacks of the conventional solder paste is that in the course of bump formation, voids are formed in the bump and this will affect the yield and reliability of the bump.

SUMMARY OF INVENTION

Accordingly, it is an object of the present invention to provide a solder paste for fabricating bumps, which can improve the yield of the bump.

Yet another object of the present invention is to provide a solder paste for bump fabrication, which can improve the reliability of the bump.

A further object of the present invention to provide a solder paste for bump fabrication which can prevent the formation of voids in the bump.

In the current re-flow process of solder paste, the flux within the solder paste will react with the oxide of the solder paste to form gases and voids are formed in the bump. This will lower the yield and reliability of the solder paste.

In order to achieve the above and other objects, the invention provides a solder paste for fabricating bumps comprising a flux and metallic alloy powder. The metallic alloy powder includes a plurality of low eutectic metallic alloy granules, and the size of these metallic alloy granules is 20–60 $\mu$m and the average size of the metallic granules is 35 to 45 $\mu$m.

In accordance with the solder paste for fabricating bumps, the weight percentage of the metallic alloy powder with respect to the solder paste is 85–95%.

In accordance with the solder paste for fabricating bumps, the metallic alloy powder is Sn/Pb alloy formed by grinding and the ratio of Sn/Pb alloy is 94–98%.

In accordance with the present invention, the metallic alloy granules are larger than that of the conventional (the size of the conventional metallic alloy granules is 4 to 25 $\mu$m and the average size of the conventional alloy granules is 12 $\mu$m), when the amount of metallic alloy used is similar, the total surface area of the metallic alloy granules is smaller than the conventional metallic alloy granules. Thus, in the re-flow process in the fabrication of bumps, the total surface area of reaction of the metallic alloy granules and the flux is significantly smaller than that of the conventional metallic alloy granules and the flux.

Consequently, the present invention reduces the product of the reaction of the flux and the solder paste in the re-flow process.

Thus, the formation of voids in the bump is reduced.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve the principles of the invention. In the drawings.

DETAILED DESCRIPTION

Figures 1, 2:
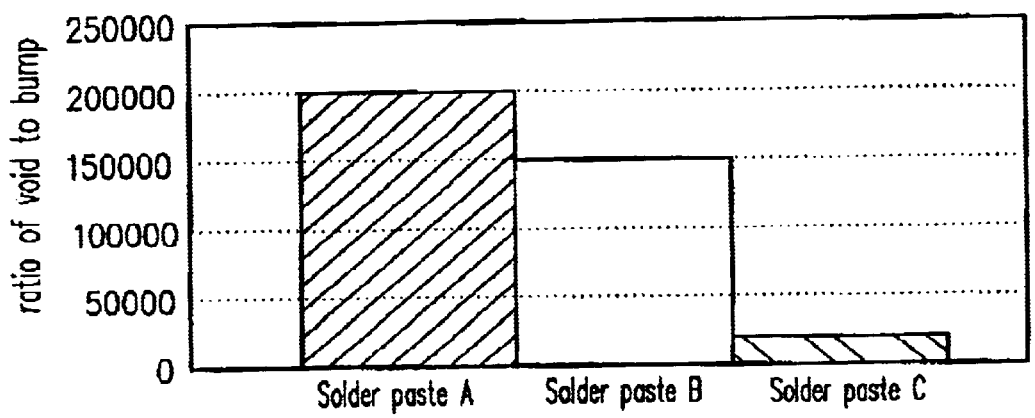
FIG. 1 is a table showing performance of the conventional solder paste (solder paste A and solder paste B) and the solder paste (solder paste C) in accordance with the present invention.
FIG. 2 shows the volume ratio of the void in the bump when solder paste A, B, C are respectively used on the fabrication of the wafer bump.

Reference will now be made in detail of the present preferred embodiments of the invention, examples of which are illustrated in the accompanying drawings. Wherever possible, the same reference numbers are used in the drawings and the description to refer to the same or like parts.

The present invention provides a solder paste for fabricating bumps, and the components of the solder paste are flux and metallic alloy powder, wherein the weight percentage of the metallic alloy powder with respect to the solder paste is about 85–95%. The metallic alloy powder is selected from low eutectic metals. For example, in the present preferred embodiment, it is obtained by the grinding of zinc lead alloy, mainly comprising a plurality of metallic alloy granules with size about 20–60 $\mu$m.

Preferably, the ratio of lead in Sn/Pb alloy is about 85–95% or 94–98%. Most preferable, the ratio of Pb/Sn is 95:5, and the average size of the metallic alloy granules is preferably about 35–45 µm.

In the present invention, the types of flux are not restricted. Generally, the flux consists of resin flux, water-soluble flux, no-clean flux, etc.

Experiments are carried out and the void:volume ratio produced on the bump using solder paste of the present invention and conventional solder paste are compared as follows:

Referring to FIG. 1, there is shown a table showing performance of the conventional solder paste (solder paste A and solder paste B) and the solder paste (solder paste C) in accordance with the present invention.

The essential components of solder paste A are flux A and metallic alloy powder of Sn/Pb alloy, and the ratio of lead and tin of the Sn/Pb alloy equals to 95:5, wherein the granules size of the metallic alloy powder of solder paste A is 4–25 µm, and the average value of the size of the granules is 12 µm. The weight percentage of metallic alloy powder of solder paste A in the solder paste A is 85% to 90%, and the viscosity of the solder paste A is 165–185 Pas.

The essential components of solder paste B are flux B and metallic alloy powder of Sn/Pb alloy, and the ratio of lead and tin of the Sn/Pb alloy equals to 95:5, wherein the granular size of the metallic alloy powder of solder paste B is 4–25 µm, and the average value of the size of the granules is 12 µm. The weight percentage of metallic alloy powder of solder paste B in the solder paste B is 85% to 90%, and the viscosity of the solder paste B is 175–185 Pas.

The essential components of solder paste C are flux C and metallic alloy powder of Sn/Pb alloy, and the ratio of lead and tin of the Sn/Pb alloy equals to 95:5, wherein the granular size of the metallic alloy powder of solder paste C is 20–60 µm, and the average value of the size of the granules is 40 µm. The weight percentage of metallic alloy powder of solder paste B in the solder paste B is 85% to 90%, and the viscosity of the solder paste B is 175–185 Pas.

The formation of voids in the bump is due to the fact that in the re-flow process of the solder paste, the oxides of the granules surface of the metallic alloy powder and the flux form chemical reaction to produce gas. The gas will cause voids on the bump. Thus the size of the granules of the metallic alloy powder and the flux are the controlling variables in the experiments of the present invention.

The difference of the components of solder paste A and solder paste B is in the flux. The flux in solder paste A is flux A, and the flux in solder paste B is flux B. The differences between the components of solder paste B and solder paste C is in the granule size of the metallic alloy powder. The size of the granules of metallic alloy powder of solder paste B is 4 µm to 25 µm and the average value of the granules size is 12 µm. The granules size of the metallic alloy powder of solder paste C is 20 µm to 60 µm and the average value of the granules size is 40 µm.

The solder pastes A, B, C are applied in the fabrication of a bump on a wafer under similar conditions, and comparison of the formation of voids in the bump with respect of the volume based on different granule size and different kinds of flux.

FIGS. 3 to 6 show the fabrication flow chart of the wafer bump in accordance with the experiments of the present invention.

Figure 3:
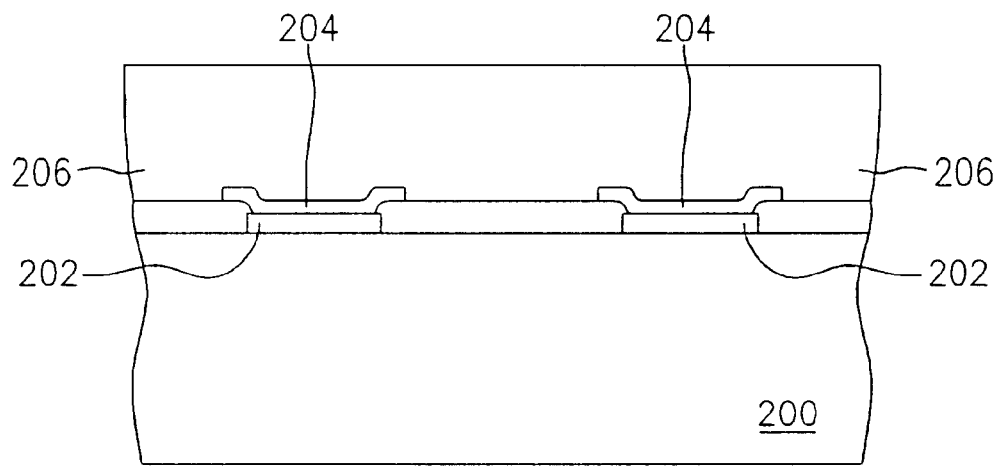
FIGS. 3 to 6 are schematic sectional views showing the fabrication flow chart of the wafer bump in accordance with the experiments of the present invention.
Figure 4:
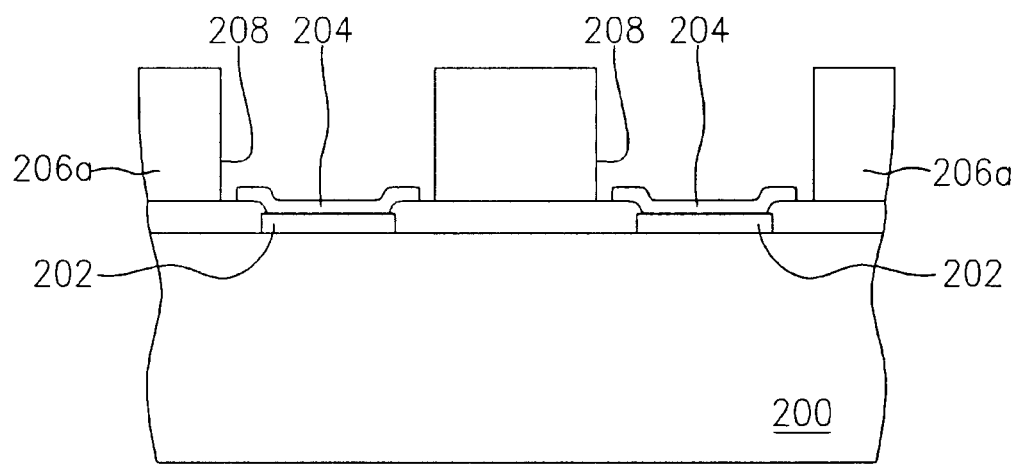

As shown in FIG. 3, the surface of the bonding pad 202 of the wafer 200 is formed into the under ball metallurgy layer 204. The surface of the wafer is adhered with a dry film 206. The thickness of the dry film 206 is 50 µm to 110 µm. Next, as shown in FIG. 4, a plurality of openings 208 are formed on the dry film 206, exposing the under ball metallurgy layer 204 to form into patterned dry film 206a. The size of the opening 208 is about 100–300 µm, preferably, 150–300 µm.

Figure 5:
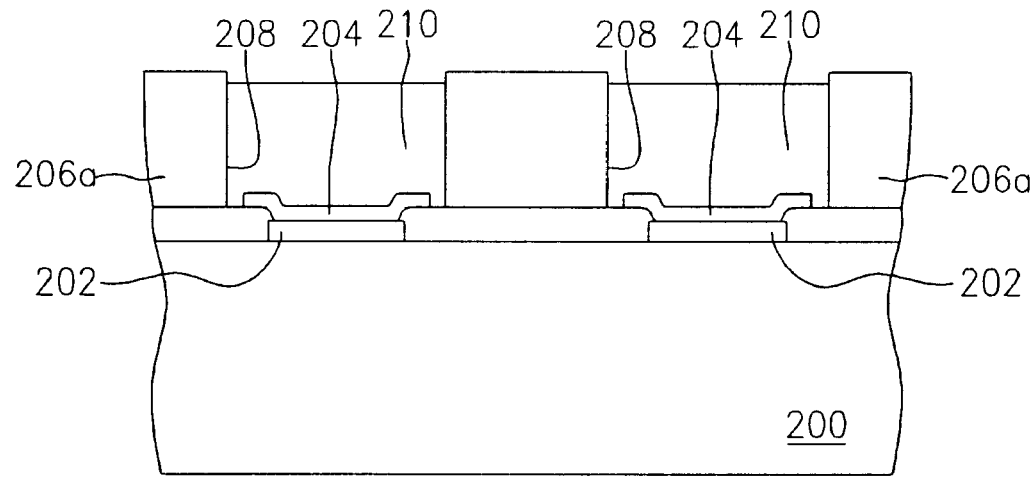
Figure 6:
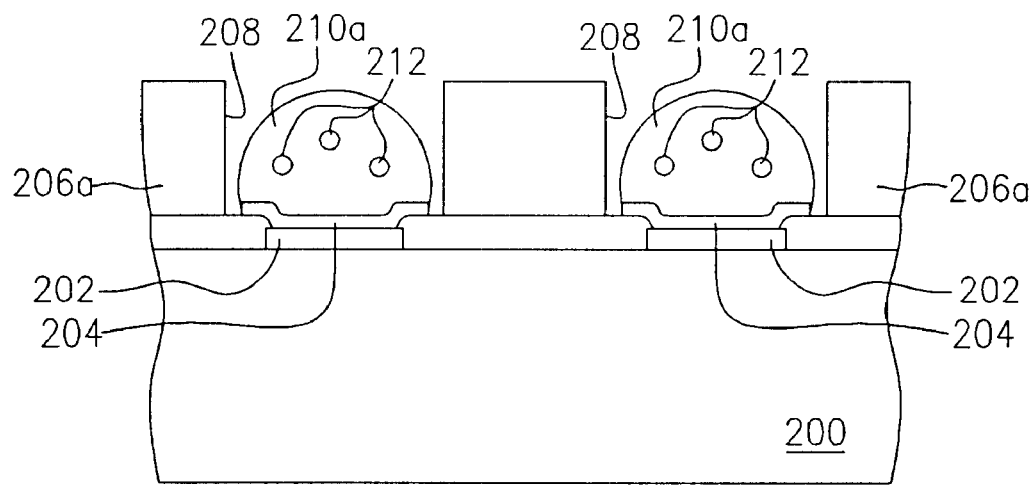

Next, as shown in FIG. 5, solder paste 210 is filled into the opening 208 by the printing method. Next, as shown in FIG. 6, a solder paste re-flow process is performed such that the solder paste 210 filled in the opening 208 forms into a spherical bump 210a, wherein the gas generated as a result of chemical reaction between oxides of the solder paste (the formation of) and the flux causes voids 212 in the bump 210a. For example, the re-flow process introduces the wafer 200 to a nitrogen environment, and the oxygen content of the controlled nitrogen environment is less than 20 ppm, and at the same time, the wafer undergoes a temperature control. The temperature of the wafer at room temperature is elevated to re-flow process temperature of 317° F. to 360° F. The time at this temperature control is about 3 mins to 20 mins.

FIG. 2 shows the experimental result of solder paste A, B, C being used on bump fabrication of wafer producing voids.

From the results of the experiments, under similar wafer bump fabrication conditions, for the bump formed using solder paste A and solder paste B, the ratio of voids to volume (void/bump) is a lot larger than that using solder paste C. The bump formed using solder paste A has a void/bump ratio of 200,000 ppm, and the bump formed using solder paste B has a void/bump ratio of 150,000 ppm. However, for the bump formed using solder paste C, the void/bump ratio is only 20,000 ppm.

From the experiment, it is shown that the main reason affecting the formation of voids in the bump is the size of the granules of the metallic alloy powder and the flux has little influence. (Solder paste A and solder paste B are formed from different flux, but the void/bump ratio is only different by 50,000 ppm.)

In accordance with the present invention, the size of the metallic alloy granule is larger than that of the conventional metallic alloy granules, when the amount of the metallic alloy is similar, in the re-flow process of bump fabrication, and the total surface of the reaction between the metallic alloy powder of the present invention and the flux is significantly smaller than that of the conventional process. Thus, the present invention reduces the reactant formed in the course of re-flow process between the flux and the solder paste. Therefore the formation of voids in the bump is reduced. In accordance with the solder paste of the present invention, the yields and reliability of the wafer bump are increased.

In view of the above preferred embodiment, the present invention provides advantages as follows:

(1) In view of the uniqueness of the present invention, the granule size of the metallic alloy is controlled between 20–60 µm. This will mitigate the formation of voids in the bump and improve the yields of the bump in a conventional wafer.

(2) In accordance with the uniqueness of the present invention, similarly, the reliability of the bump of the conventional wafer is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A solder paste for fabricating bumps comprising a flax, and metallic alloy powder including a plurality of metallic alloy granules, wherein a size of the metallic alloy granules ranges from about 20 μm to about 60 μm.

2. The solder paste of claim 1, wherein the size of the metallic alloy granules ranges from about 35 μm to about 45 μm.

3. The solder paste of claim 1, wherein a weight percent of the metallic alloy powder ranges from about 85% to about 95% of the solder paste for fabricating the bumps.

4. The solder paste of claim 1, wherein the metallic alloy powder includes ground Sn/Pb alloy.

5. The solder paste of claim 1, wherein the metallic alloy powder includes ground low eutectic metallic alloy.

6. The solder paste of claim 4, wherein a ratio of Pb to Sn in the alloy is 95:5.

7. The solder paste of claim 4, wherein a ratio of Pb to Sn ranges from about 94% to about 98% of a weight percentage of lead.

8. A solder paste for fabricating bumps comprising a flux, and metallic alloy powder including a plurality of Sn/Pb alloy granules, wherein a ratio of lead to the Sn/Pb alloy ranges from about 85% to about 95% and a size of the metallic alloy granules ranges from about 20 μm to about 60 μm.

9. The solder paste of claim 8, wherein the metallic alloy powder includes ground low eutectic metallic alloy.

10. The solder paste of claim 8, wherein the size of the metallic alloy granules ranges from about 35 μm to about 45 μm.

11. The solder paste of claim 8, wherein a weight percentage of the metallic alloy powder ranges from about 85% to about 95% of the solder paste for fabricating the bumps.

12. A solder paste for fabricating bumps comprising:

a flux, and metallic alloy powder including a plurality of metallic alloy granules, wherein an average size of the metallic alloy granules is in a range of 35–45 μm.

* * * * *